United States Patent
Zhang et al.

(10) Patent No.: US 6,630,702 B2
(45) Date of Patent: Oct. 7, 2003

(54) METHOD OF USING TITANIUM DOPED ALUMINUM OXIDE FOR PASSIVATION OF FERROELECTRIC MATERIALS AND DEVICES INCLUDING THE SAME

(75) Inventors: Fengyan Zhang, Vancouver, WA (US); Sheng Teng Hsu, Camas, WA (US); Hong Ying, San Jose, CA (US)

(73) Assignee: Sharp Laboratories of America, Inc., Camas, WA (US)

( * ) Notice: Subject to any disclaimer, the term of this patent is extended or adjusted under 35 U.S.C. 154(b) by 3 days.

(21) Appl. No.: 09/819,546

(22) Filed: Mar. 27, 2001

(65) Prior Publication Data

US 2002/0140011 A1 Oct. 3, 2002

(51) Int. Cl.$^7$ ............... H01L 27/108; H01L 29/76; H01L 29/94; H01L 31/119
(52) U.S. Cl. .......................... 257/295; 257/306
(58) Field of Search ............... 257/295–310; 438/3, 240, 253–254, 396–398

(56) References Cited

U.S. PATENT DOCUMENTS

2001/0034106 A1 * 10/2001 Moise et al. ............... 438/396

OTHER PUBLICATIONS

Article entitled, Degradation–Free Ferroelectric Pb(Zr,Ti)O$_3$ Thin Film Capacitors with IrO$_2$ Top Electrode, by Fujisaki et al., published in Integrated Ferroelectrics, vol. 21, pp. 83–95.

* cited by examiner

Primary Examiner—Cuong Quang Nguyen
(74) Attorney, Agent, or Firm—David C. Ripma; Matthew D. Rabdau; Scott C. Krieger

(57) ABSTRACT

A passivation layer comprises a titanium-doped aluminum oxide layer for passivation of ferroelectric materials such as Pt/SBt/Ir—Ta—O devices. The titanium-doped aluminum oxide layer for passivation of ferroelectric materials has reduced stress and improved passivation properties, and is easy to deposit and be oxidized. The passivation layer in the MFM Structure resists breakdown and peeling during annealing of the device in a forming gas ambient.

10 Claims, 4 Drawing Sheets

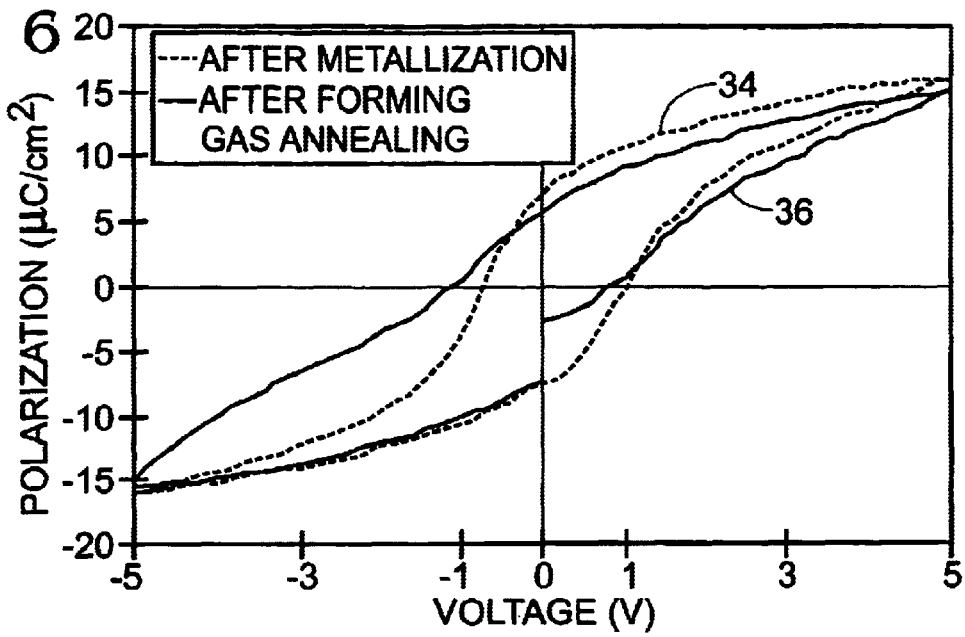
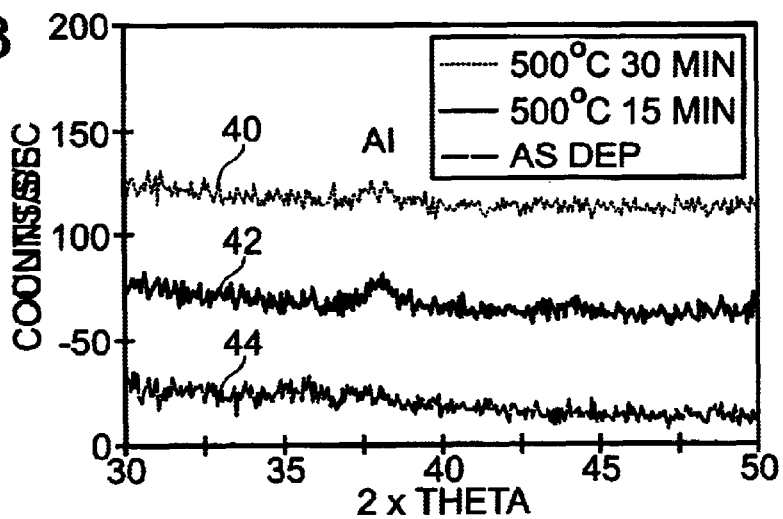
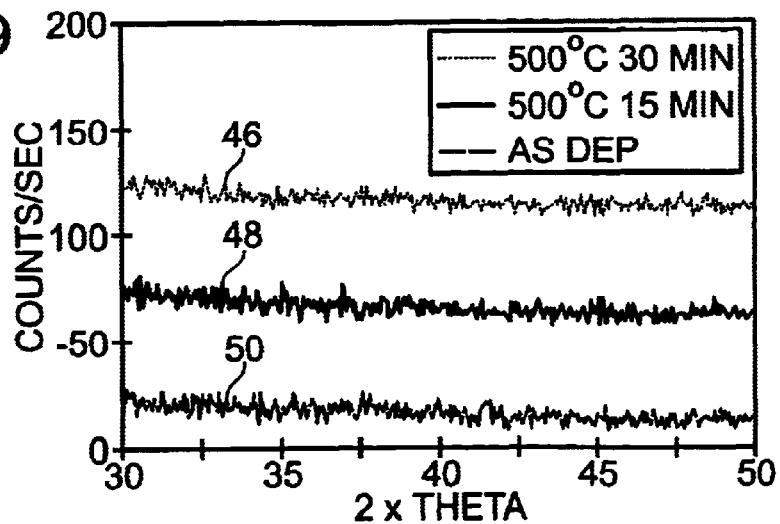

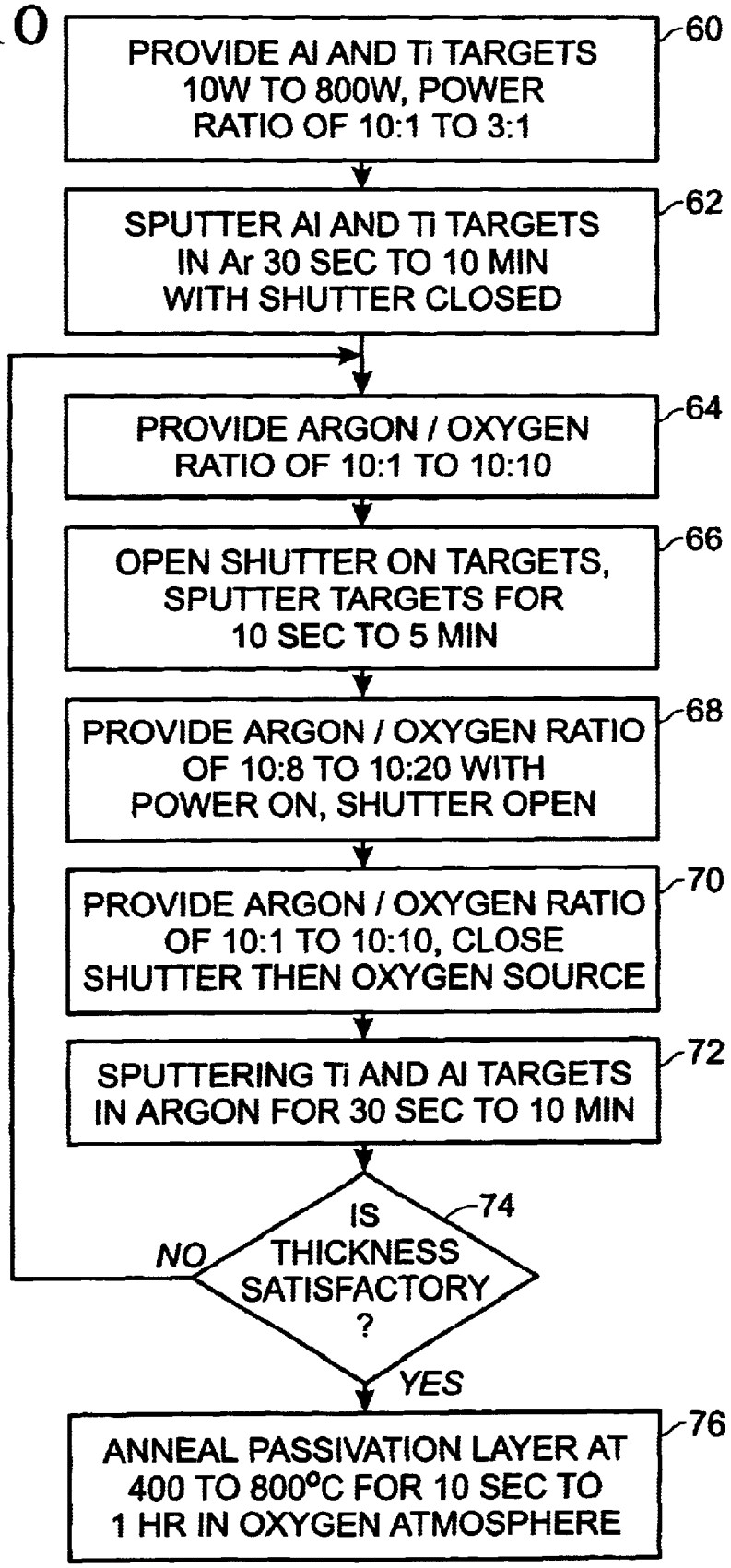

METHOD OF USING TITANIUM DOPED ALUMINUM OXIDE FOR PASSIVATION OF FERROELECTRIC MATERIALS AND DEVICES INCLUDING THE SAME

FIELD OF THE INVENTION

This invention relates to a method of using titanium-doped aluminum oxide for passivation of ferroelectric materials and devices including the same and, more particularly, to a method of using titanium-doped aluminum oxide for passivation of ferroelectric materials and devices including the same in FeRAM and DRAM applications.

BACKGROUND OF THE INVENTION

Ferroelectric random access memory (FeRAM) is a promising device because it has similar access and rewrite speeds as dynamic random access memory (DRAM), with the additional feature of non-volatility. The low power operation of FeRAMs is also a great advantage when used in Flash memory. FeRAM structures, therefore, may be widely used in the future, if these structures can be successfully integrated into real working devices.

The attempt to integrate ferroelectric materials into real devices, however, has resulted in many difficulties. In particular, when integrating the ferroelectric material into FeRAM and DRAM devices, the ferroelectric material is usually sandwiched between a bottom and a top electrode in order to polarize the ferroelectric material. Passivation of the ferroelectric material, therefore, usually requires passivation of the metal/ferroelectric/metal (MFM) structure. Platinum (Pt) has been widely used as the material for the top and bottom electrodes in ferroelectric material based devices such as capacitors. The major drawback of using Platinum as a top electrode is its catalytic nature with Hydrogen. It has been found that the integrity of the Platinum top electrode can be severely damaged during forming gas annealing (typically having a composition of approximately 95% nitrogen and 5% hydrogen) at 400 degrees Celsius for just thirty seconds. Furthermore, Platinum accelerates the decomposition of the $H_2$ molecules into atomic Hydrogen which attacks and deoxidizes the oxide based ferroelectric material and degrades its ferroelectric properties. Accordingly, passivation layers have been deposited on the top Platinum electrode so as to shield the electrode and the ferroelectric material from the consequences of annealing in a forming gas ambient.

Titanium Dioxide ($TiO_2$) has been shown to have passivation properties toward gas annealing in a forming gas ambient. For the forming gas annealing step, the pressure may range from only a few mTorr to 76 Torr or higher. A very thin layer of $Al_2O_3$ has also been shown to be effective in protecting ferroelectric capacitors during forming gas annealing. However, MFM structures with $TiO_2$ passivation layers have been shown to be more susceptible to leakage after the forming gas annealing step. $Al_2O_3$ layers deposited by physical vapor deposition (PVD) show large stress factors and are difficult to oxidize. Some researchers have used $Si_3N_4$ as a passivation layer. However, it has been found that when a $Si_3N_4$ layer is deposited directly on the top electrode an undesirable reaction occurs between the $Si_3N_4$ and the top electrode.

Due to these deficiencies in the passivation layers heretofore utilized, which are susceptible to problems during the forming gas annealing step of manufacturing, prior art ferroelectric devices have a reduced remnant polarization and a reduced dielectric constant of the ferroelectrial material after annealing.

SUMMARY OF THE INVENTION

This invention comprises a passivation material that can be used in nonvolatile memory devices, DRAMs, capacitors, pyroelectric infrared sensors, optical displays, optical switches, piezoelectric transducers, and surface acoustic wave devices. More particularly, the invention comprises a titanium-doped aluminum oxide layer for passivation of ferroelectric materials and a method of manufacturing the same and, more particularly, to a titanium-doped aluminum oxide layer for passivation of ferroelectric materials that has reduced stress and improved passivation properties, and that is easy to deposit and be oxidized.

In one embodiment the invention comprises an integrated circuit device comprising a ferroelectric material positioned between first and second metal electrodes; and a passivation layer positioned on said first electrode, said passivation layer comprising Titanium doped Aluminum Oxide. The invention also comprises a method of manufacturing an integrated circuit device including a ferroelectric structure having a passivation layer, comprising the steps of: providing a deposition chamber; providing in said deposition chamber a ferroelectric structure including a ferroelectric material positioned between top and bottom electrodes; providing Aluminum and Titanium targets in said deposition chamber; and sputtering said Aluminum and said Titanium targets so as to form a Titanium doped Aluminum Oxide passivation layer on said top electrode.

Accordingly, an object of the invention is to provide a passivation material that can be used in nonvolatile memory devices, DRAMs, capacitors, pyroelectric infrared sensors, optical displays, optical switches, piezoelectric transducers, or surface acoustic wave devices.

Another object of the invention is to provide a titanium-doped aluminum oxide layer for passivation of ferroelectric materials and a method of manufacturing the same.

A further object of the invention is to provide a titanium-doped aluminum oxide layer for passivation of ferroelectric materials that has reduced stress and improved passivation properties Still a further object of the invention is to provide a titanium-doped aluminum oxide layer for passivation of ferroelectric materials that is easy to deposit and be oxidized.

BRIEF DESCRIPTION OF THE DRAWINGS

FIG. 6 is a hysteresis loop of the MFM structure of FIG. 5.

FIG. 8 is a graph of an X-ray Diffraction spectrum of a Titanium doped Aluminum Oxide passivation layer sputtered in pure Argon and annealed at different conditions.

FIG. 9 is a graph of an X-ray Diffraction spectrum of a Titanium doped Aluminum Oxide passivation layer sputtered in a mix of Argon and Oxygen at different annealing conditions.

FIG. 10 is a flowchart of the method of the present invention.

DETAILED DESCRIPTION OF THE PREFERRED EMBODIMENTS

Figure 1:
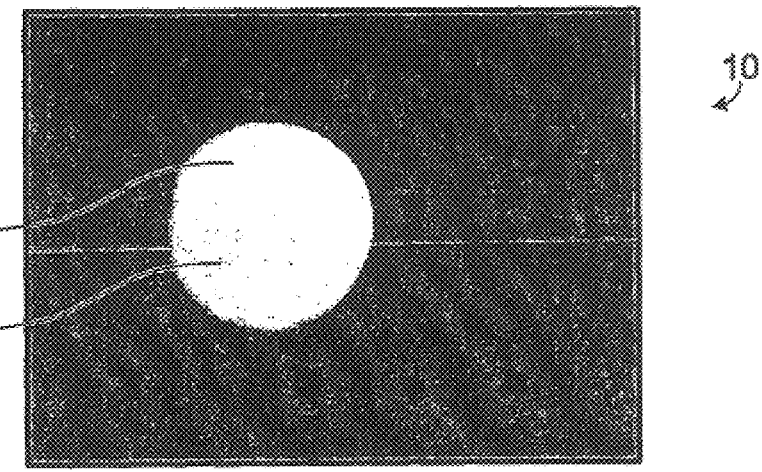
FIG. 1 is a photograph of a damaged prior art MFM structure having an $Al_2O_3$ passivation layer after forming gas annealing.

Turning now to the drawings, FIG. 1 shows a photograph of a damaged prior art device 10 comprising a capacitor including an $AlO_x$ passivation layer 12, namely $Al_2O_3$, on a metal/ferroelectric/metal (MFM) structure 14. MFM structure comprises a Platinum (Pt) top electrode on a Strontium Bismuth Tantalate (SBT or $SrBi_2Ta_2O_9$) ferroelectric material, which is on an Iridium Tantalum Oxygen (Ir—Ta—O) bottom electrode. The $AlO_x$ passivation layer was deposited by sputtering Aluminum in an $O_2$ atmosphere, or ambient, and then subjecting the structure to rapid thermal processing (RTP) in an Oxygen ambient at 500 degrees Celsius for thirty minutes. The structure was then subjected to forming gas annealing at 400 degrees Celsius for five minutes in a forming gas ambient. The forming gas normally comprises nitrogen and hydrogen with hydrogen present in a range of 3% to 5%, with nitrogen comprising, essentially, the remainder of the gas composition. However, the hydrogen may be present in the forming gas in a range of anywhere from 1% to 15%. The pressure of the forming gas ambient may be anywhere from several mTorr to 76 Torr or more. The $AlO_x$ layer formed has a thickness of approximately 325 Angstroms (325 A). The passivation layer formed on the MFM structure shows Hydrogen damage due to the annealing process. In particular, during the annealing step most of the top electrode peeled from the ferroelectric layer and the capacitor shorted. Accordingly, the $AlO_x$ passivation layer is unsatisfactory for use in real devices.

Figure 2:
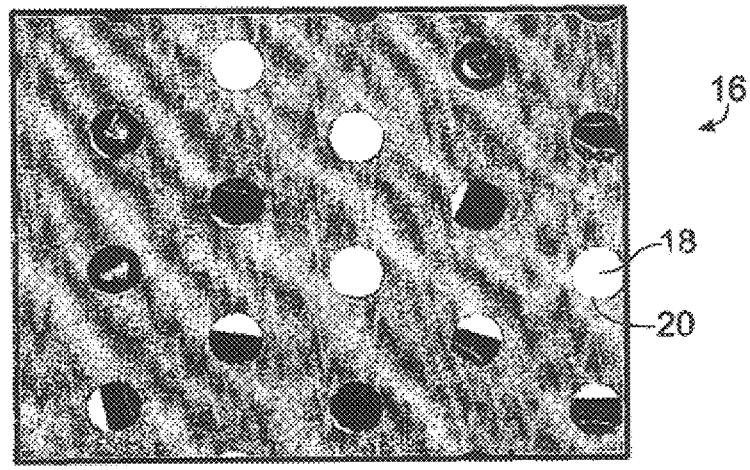
FIG. 2 is a photograph of a damaged prior art MFM structure having a $TiO_2$ passivation layer after annealing in an oxygen ambient.

FIG. 2 is a photograph of a damaged prior art device 16 comprising a capacitor having a $TiO_2$ passivation layer 18 on a metal/ferroelectric/metal (MFM) structure 20. MFM structure 20 comprises a Platinum top electrode on a Strontium Bismuth Tantalate (SBT or $SrBi_2Ta_2O_9$) ferroelectric material, on an Iridium Tantalum Oxygen bottom electrode. The $TiO_2$ passivation layer was deposited by reactive sputtering a Titanium target in an Oxygen atmosphere. The thickness of the deposited $TiO_2$ layer is approximately 800 Angstroms. The structure was then subjected to an annealing process in an Oxygen atmosphere at 500 degrees Celsius for thirty minutes. The structure having the $TiO_2$ passivation layer appeared to have undergone even more stress than the structure having the $AlO_x$ passivation layer of FIG. 1. After the annealing step, it can be seen that most of the top electrode of structure 20 has peeled off the ferroelectric material. Accordingly, the $TiO_2$ passivation layer is unsatisfactory for use in real devices.

Figure 3:
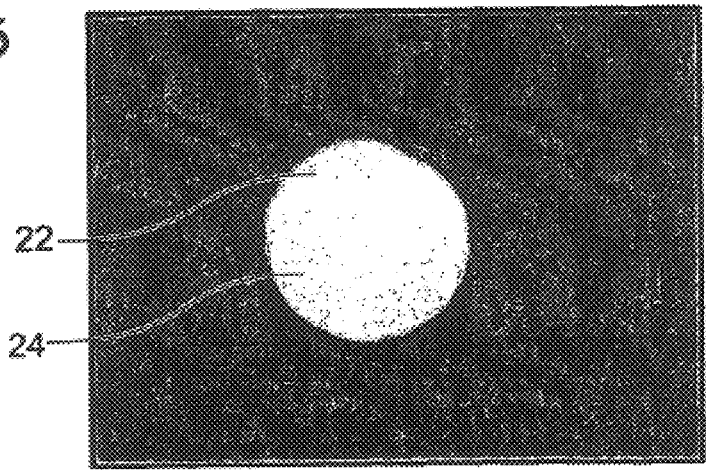
FIG. 3 is a photograph of an undamaged MFM structure having a Titanium doped Aluminum Oxide passivation layer of the present invention after forming gas annealing.

FIG. 3 is a photograph of an undamaged MFM structure 22 having the Titanium doped Aluminum Oxide passivation layer 24 of the present invention. MFM structure 22 comprises a Platinum top electrode on a Strontium Bismuth Tantalate (SBT or $SrBi_2Ta_2O_9$) ferroelectric material, on an Iridium Tanalum Oxygen bottom electrode. The Titanium doped Aluminum Oxide (Al—Ti—O) passivation layer 24 was deposited by co-sputtering Titanium and Aluminum targets in an $O_2$ atmosphere followed by an in-situ plasma treatment, the details of which are set forth below. The film was annealed in an oxygen ambient at 500° C. for thirty minutes. By oxygen ambient Applicants mean an oxygen rich atmosphere. The oxygen ambient may comprise an atmosphere having an oxygen content of as little as 20% or more. An oxygen content of 50% or more is preferred and an oxygen content of 99% or more is ideal. The structure was then subjected to an annealing step at 400 degrees Celsius for five minutes in a forming gas ambient to test the device. The Al—Ti—O passivation layer formed on the MFM has a thickness of approximately 226 Angstroms (226 A). The passivation layer shows no Hydrogen damage due to the annealing process. In particular, during the annealing step the top electrode did not peel from the ferroelectric layer and the capacitor did not short. Accordingly, the Al—Ti—O passivation layer of the present invention is satisfactory for use in real devices.

Figure 4:
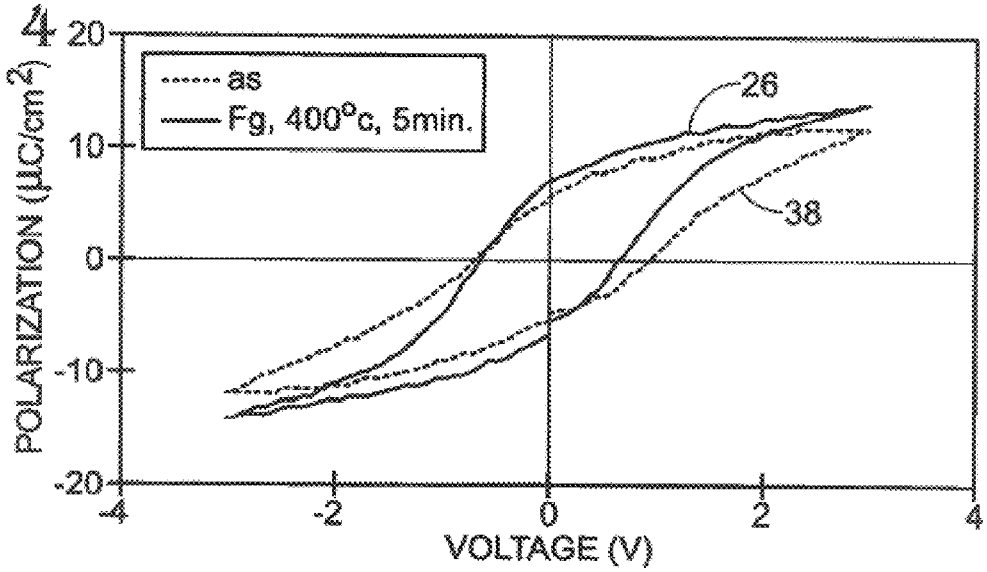
FIG. 4 is a hysteresis loop of the MFM structure of FIG. 3.

FIG. 4 is a hysteresis loop of the MFM structure of FIG. 3. Hysteresis loop 26 shows the polarization versus voltage before annealing of the MFM device of FIG. 3. Heteresis loop 28 shows the remnant polarization (Pr) of MFM structure 22 of FIG. 3 after forming gas annealing of the metal-ferroelectric-metal (MFM) structure at 400 degrees Celsius for five minutes. The MFM structure is shown to have maintained good integrity and its remnant polarization remains almost the same after the annealing step. In particular, the remnant polarization of the MFM structure after forming gas annealing is within 20% of the remnant polarization of the structure before the annealing step. Accordingly, the Ti—Al—O passivation layer of the present invention is an improvement over the passivation layers of the prior art shown in FIGS. 1 and 2 and can be used in real working devices.

Figure 5:
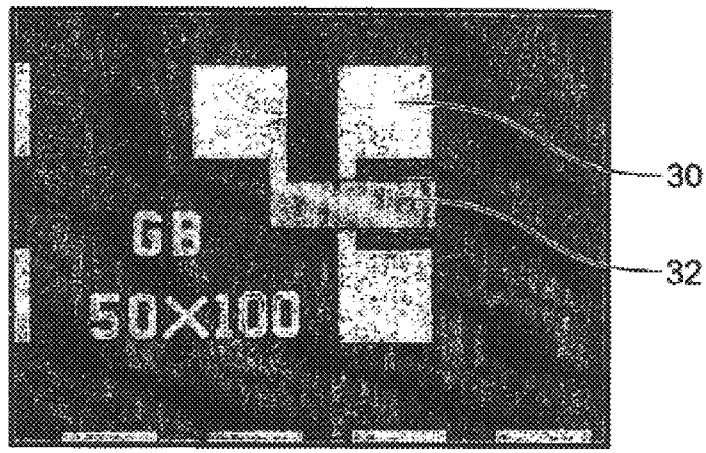
FIG. 5 is a photograph of a single transistor with a Titanium doped Aluminum Oxide passivation layer after forming gas annealing.

FIG. 5 is a photograph of a single transistor 30 with a Titanium doped Aluminum Oxide passivation layer 32. The passivation layer was formed by co-sputtering Titanium and Aluminum targets in an $O_2$ ambient and then annealing in an oxygen ambient at 500 degrees Celsius for thirty minutes. The manufacturing steps include inter-layer dielectric (ILD) layer deposition, contact etch, metallization and a final annealing step at 400 degrees Celsius for five minutes in a forming gas ambient to test the structure. The Al—Ti—O layer formed has a thickness of approximately 350 Angstroms (350 A). The MFM structure on the SBT single transistor shows no Hydrogen damage due to the annealing process. In particular, during the annealing step the top electrode did not peel from the ferroelectric layer and the capacitor did not short. Accordingly, the Al—Ti—O passivation layer single transistor performed satisfactorily.

FIG. 6 is a hysteresis loop of the MFM structure of FIG. 5 after metallization and after the annealing step. In particular, loop 34 is a hysteresis loop of the SBT film buried in the single transistor after the metallization step and before the forming gas annealing step. Loop 36 is a hysteresis loop of the SBT film buried in the single transistor after the forming gas annealing step at 400 degrees Celsius for five minutes in a forming gas ambient. As shown by the graph, the remnant polarization 36 of the transistor does not substantially change after the annealing step, and is with 20 percent of the remnant polarization of hysteresis loop 34.

Figure 7:
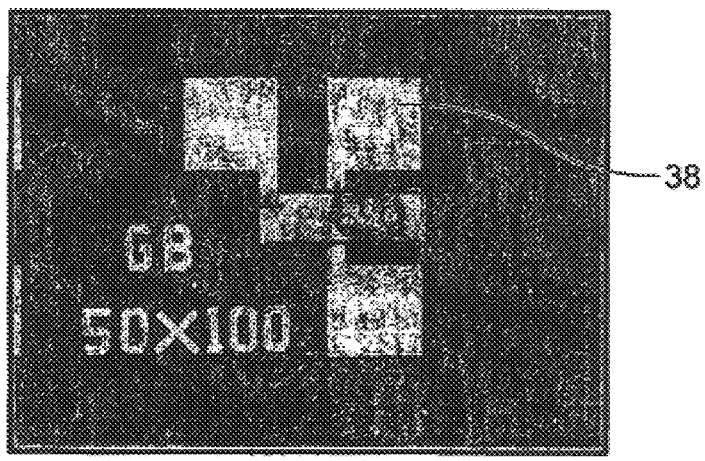
FIG. 7 is a photograph of a single transistor without a Titanium doped Aluminum Oxide passivation layer after forming gas annealing.

FIG. 7 is a photograph of a single transistor 38 without a Titanium doped Aluminum Oxide passivation layer. As can be seen in the photograph, the transistor without the Titanium doped Aluminum Oxide passivation layer has failed. Accordingly, no hysteresis loop is shown for the failed transistor.

FIG. 8 is a graph of the X-ray Diffraction spectrum of a Titanium doped Aluminum Oxide passivation layer sputtered in pure Argon at different annealing conditions, wherein the x-axis represents degrees (2×theta) and the y-axis represents counts/second. In particular, the Ti—Al—O passivation layer, including preferably a 15% or less doping of Titanium, was deposited in pure Argon. Passivation layers deposited under these conditions are shown as subjected to three annealing conditions: 500 degrees Celsius for thirty minutes (line 40); 500 degrees Celsius for fifteen minutes (line 42); and as deposited (line 44). The annealing steps took place in an Oxygen ambient for full oxidation. It can be seen from the graph that metallic Aluminum with lightly doped Titanium deposited in pure Argon is very hard to oxidize.

FIG. 9 is a graph of the X-ray Diffraction spectrum of a Titanium doped Aluminum Oxide passivation layer sputtered in a mix of Argon and Oxygen and at different annealing conditions. In particular, the Ti—Al—O passivation layer, including a 15% doping of Titanium, was deposited in an Argon/Oxygen mixture of: $Ar/O_2$ =5 mtorr/1 to 4 mtorr partial pressures. The structure was then further annealed in an Oxygen atmosphere for full oxidation. Passivation layers deposited under these conditions are shown as subjected to three annealing conditions: 500 degrees Celsius for thirty minutes (line 46); 500 degrees Celsius for fifteen minutes (line 48); and as deposited (line 50). It can be seen that metallic Aluminum with lightly doped Titanium, reactive sputtered in $Ar/O_2$=5 mtorr/1 to 4 mtorr, is more easily oxidized than the Aluminum oxide without any doping.

It has also been found that the reactive sputtered Aluminum based oxide with lightly doped Titanium deposited in high oxygen partial pressures ($Ar/O_2$=5 mtorr/4 to 10 mtorr) has a very low deposition rate. This phenomenon is explained in that the deposition only occurred at the very beginning of the deposition, so that the surface of the targets are oxidized and the deposition stopped after oxidization of the targets. Accordingly, this phenomenon can be used as an advantage in plasma treatment of the already deposited oxide film. In particular, the shutters provided at the targets are initially closed so as to allow sputtering of the targets themselves. The shutters are then opened so as to allow sputtering of the wafer. The shutters then remain open and the oxygen pressure is increased, so as to continue to generate an oxygen plasma. In other words, when the oxygen partial pressure is high, the deposition of the passivation film is essentially stopped, but the oxygen plasma continues to be generated. With the shutter open, the oxygen plasma can reach the surface of the already deposited Titanium doped Aluminum Oxide and further oxidize the film.

FIG. 10 is a flowchart of the method of the present invention. The method comprises co-sputtering Aluminum and Titanium targets in an Oxygen environment followed by an in-situ plasma treatment and a final annealing step. The co-sputtering steps can be repeated multiple times until the desired thickness of the titanium doped Aluminum Oxide film is reached. Referring now to the particular method steps, step 60 includes providing four inch Aluminum and Titanium targets. Of course, other sized targets may be provided. The sputtering power on the four inch targets may range from 10 W to 800 W. The ratio of the powers on the Al and Ti targets is preferably about 10:1 to 3:1 to obtain atomic percent Ti at 1% to 30% in the Al—Ti—O film. Step 62 includes sputtering the surface of the MFM device, such as a Pt/SBT/Ir—Ta—O structure, in an Argon environment with the shutter closed for 30 seconds to 10 minutes. Step 64 includes turning on the Oxygen gas supply. The Argon/Oxygen ratio is between 10/1 to 10/10. Step 66 comprises opening the shutter on the Al and the Ti targets and then sputtering the targets for 10 seconds to five minutes. Step 68 includes increasing the Oxygen partial pressure so that the $Ar/O_2$ ratio is between approximately 10/8 to 10/20. The power is retained on both the targets to the shutter is retained open. At this stage of the process, the deposition rate is very slow and the generated $O_2$ plasma will oxidize the already sputtered Titanium doped Aluminum Oxide film. Step 70 includes reducing the Oxygen partial pressure to 10/1 to 10/10, closing the shutter, and closing the Oxygen source. Step 72 includes sputtering the Ti and Al target surfaces in an Argon atmosphere for another 30 seconds to 10 minutes. Step 74 includes determining whether the thickness of the deposited Titanium doped Aluminum Oxide film (Ti doped $Al_2O_3$) is satisfactory. The film thickness of each cycle including steps 62–72 is approximately 50 to 500 Angstroms, depending on the sputtering power and the sputtering time. If the thickness is not satisfactory, then steps 64–72 are repeated. If the thickness is satisfactory, then the method is continued without repeating steps 64–72. The steps preferably are repeated until the passivation layer thickness is in a range of approximately 200 to 500 Angstroms or more. Step 76 includes annealing the Ti doped $Al_2O_3$ layer at a temperature in a range of 400 to 800 degrees Celsius for approximately ten seconds to one hour in an Oxygen atmosphere to fully oxidize the film.

The method steps listed above result in a passivation layer comprised of Titanium doped Aluminum Oxide which has reduced stress compared with pure Aluminum Oxide films. The Titanium doped Aluminum Oxide also is easier to oxidize than pure Aluminum Oxide films. The inventive passivation layer allows one to passivate low melting point ferroelectric materials such as $Pb_5Ge_3O_{11}$ (PGO) because deposition of such structures should take place at temperatures of less than 600 degrees Celsius or the PGO structure will decompose.

Plasma treatment of the Titanium doped Aluminum Oxide in the deposition chamber is carried out simply by increasing the Oxygen partial pressure within the chamber. At this stage in the process, the surfaces of the targets become oxidized, such that the deposition rate becomes very slow. However, the generated Oxygen plasma will continue to oxidize the already deposited film. After the plasma treatment, sputtering the targets with Argon can clean away the oxidized surfaces. The method can then continue with the next layer of the deposition process.

The multiple deposition and plasma treatment method set forth above can also be used for other oxide depositions, such as $TiO_2$, $Al_2O_3$, $ZrO_2$, $HfO_2$, $Ta_2O_5$, and doped oxides of these compounds. The Titanium doped Aluminum Oxide can also be deposited by physical vapor deposition methods such as ECR sputtering, DC magnetron sputtering, RF sputtering, E-beam evaporation, and by chemical vapor deposition (CVD), metal organic chemical vapor deposition (MOCVD), and atomic layer chemical vapor deposition (ALCVD) methods.

Thus, a passivation material that can be used in nonvolatile memory devices, DRAMs, capacitors, pyroelectric infrared sensors, optical displays, optical switches, piezoelectric transducers, and surface acoustic wave devices, has been described. Additionally, a titanium-doped aluminum oxide layer for passivation of ferroelectric materials and a method of manufacturing the same and, more particularly, a titanium-doped aluminum oxide layer for passivation of ferroelectric materials that has reduced stress and improved passivation properties after forming gas annealing, and that is easy to deposit and be oxidized, has been described. Although preferred structures and methods of manufacturing the device have been disclosed, it should be appreciated that further variations and modifications may be made thereto without departing from the scope of the invention as defined in the appended claims.

We claim:

1. An integrated circuit device comprising:
   a ferroelectric material positioned between first and second metal electrodes; and
   a passivation layer directly contacting said first electrode, said passivation layer comprising Titanium doped Aluminum Oxide.

2. The device of claim 1 wherein said passivation layer has a thickness of at least 200 Angstroms.

3. The device of claim 1 wherein said first electrode comprises Platinum.

4. The device of claim 1 wherein said ferroelectric material comprises SBT.

5. The device of claim 1 wherein said passivation layer remains adhered to said first electrode after being annealed in an oxygen ambient at a temperature greater than 300 degrees Celsius for at least one minute.

6. The device of claim 1 wherein said passivation layer remains adhered to said first electrode after being annealed in a forming gas ambient at a temperature of at least 400 degrees Celsius for at least five minutes.

7. The device of claim 6 wherein said metal electrode-ferroelectric-metal electrode structure defines a first polarization hysteresis loop before being annealed in a forming gas ambient at a temperature of at least 400 degrees Celsius for a time period of at least five minutes, and defines a second polarization hysteresis loop after being annealed in a forming gas ambient at a temperature of at least 400 degrees Celsius for a time period of at least five minutes, and wherein a polarization of said first polarization hysteresis loop is within twenty percent of a polarization of said second polarization hysteresis loop.

8. The device of claim 1 wherein said integrated circuit device is chosen from the group consisting of: a nonvolatile memory device, a FeRAM, a DRAM, a capacitor, a pyroelectric infrared sensor, an optical display, an optical switch, a piezoelectric transducer, and a surface acoustic wave device.

9. The device of claim 1 wherein said second electrode comprises Iridium, Tantalum and Oxygen.

10. The device of claim 1 wherein said passivation layer comprises at most a 15% Titanium doping.

* * * * *